United States Patent

[11] 3,579,150

[72] Inventor Rosario S. Badessa
Dedham, Mass.
[21] Appl. No. 863,589
[22] Filed Oct. 3, 1969
[45] Patented May 18, 1971
[73] Assignee Damon Engineering, Inc.
Needham Heights, Mass.

[54] VOLTAGE CONTROLLED OSCILLATOR
10 Claims, 2 Drawing Figs.

[52] U.S. Cl. .......... 332/19,
330/69, 330/104, 331/108, 331/135, 332/23, 332/30
[51] Int. Cl. .......... H03c 3/08,
H03b 5/20, H03f 1/34
[50] Field of Search .......... 332/16, 16 (T), 19, 23, 30, 30 (V); 330/30 (D), 69, 104, 107, 109; 331/108, 135, 137

[56] References Cited

UNITED STATES PATENTS

| | | | |
|---|---|---|---|
| 2,173,427 | 9/1939 | Scott | 330/104X |
| 2,586,167 | 2/1952 | Kamm | 330/104X |
| 3,345,582 | 10/1967 | Maupin | 331/108(4) |
| 3,393,380 | 7/1968 | Webb | 332/30X |
| 3,448,292 | 6/1969 | Mueller | 331/137X |
| 3,482,188 | 12/1969 | Crouse | 331/135 |

OTHER REFERENCES

Carlow " IC op amp simplified design of crystal-controlled oscillator" - Electronic Design 1, Jan. 4, 1969 p. 124,126 331-108 B

*Primary Examiner*—Alfred L. Brody
*Attorney*—Kenway, Jenney and Hildreth

ABSTRACT: The oscillator disclosed herein employs a high gain differential amplifier of a type having a relatively low offset voltage between the input terminals. A positive feedback signal is applied to the noninverting input terminal of the amplifier and a delayed negative feedback signal is applied to the inverting input terminal, the delay being provided by a capacitor connected to the inverting terminal. This combination of feedback components causes the amplifier to oscillate at a frequency which is a function of the delay provided by the capacitor. The effective delay is then varied by means of an AC signal which is applied to the capacitor in synchronism with the amplifier output signal. The AC signal is obtained by means of a chopper which is synchronized or driven by the amplifier and which operates on a control or modulation signal provided to the oscillator. The amplitude of the AC signal applied to the capacitor will thus be proportional to the amplitude of the modulation signal. Accordingly, the frequency of oscillation is variable as a function of the modulation signal amplitude.

INVENTOR
ROSARIO S. BADESSA
BY
Kenway, Jenney & Hildreth
ATTORNEYS

VOLTAGE CONTROLLED OSCILLATOR

BACKGROUND OF THE INVENTION

In various control and data transmission situations, it is desirable to have an oscillator whose frequency of oscillation is precisely and predictably controllable by means of a control or modulation signal applied to the oscillator. Such oscillators are often referred to as voltage controlled oscillators and various types of such oscillators are known in the art, e.g. relaxation oscillators employing unijunction transistors, astable transistor multivibrators, and the like. Such variable frequency oscillators conventionally employ a capacitor which is alternately charged and discharged at controlled rates. It has, however, often been difficult to obtain precise and predictable control of the voltage variable frequency characteristic due to unpredictable variation in the thresholds at which the capacitor charging reverses. Typically, the upper and lower thresholds are not only variable, e.g. as a function of temperature, but vary differently so that precise control is difficult.

Among the several objects of the present invention may be noted the provision of a variable frequency oscillator whose frequency of operation is readily controllable by means of a control or modulation signal applied to the oscillator; the provision of such an oscillator which is highly stable; the provision of such an oscillator in which the frequency variable characteristic is consistent and accurately predictable; the provision of such an oscillator in which frequency varies substantially linearly with the amplitude of the control signal; and the provision of such an oscillator which is reliable and which is relatively simple and inexpensive.

Other objects and features will be in part apparent and in part pointed out hereinafter.

SUMMARY OF THE INVENTION

Briefly, an oscillator according to the present invention generates an output signal at a frequency which is controllable by means of a modulation signal applied to the oscillator. A differential amplifier is employed which has an inverting input terminal, a noninverting input terminal and an output terminal, the amplifier being operative to provide at the output terminal an output signal which is a highly amplified function of an input signal applied between the input terminals. A preselected amount of positive feedback is applied to the noninverting input terminal from the output terminal by a suitable resistive network. A variable delay means, which includes a capacitor connected to the inverting input terminal of the amplifier, is provided for applying to that input terminal a negative feedback signal which is a delayed function of the amplifier output signal. This combination of feedback signals causes the amplifier to oscillate at a frequency which is a function of the delay. The delay means additionally includes modulating means for providing an AC signal having a frequency which is in phase with the amplifier output signal and an amplitude which is substantially proportional to the amplitude of the control or modulation signal. This AC signal is applied to the capacitor to vary the effective delay in the signal applied to the inverting input terminal of the amplifier. Accordingly, the frequency of oscillation of the amplifier may be varied as a function of the amplitude of the modulation signal.

DESCRIPTION OF THE PREFERRED EMBODIMENT

Figure 1:
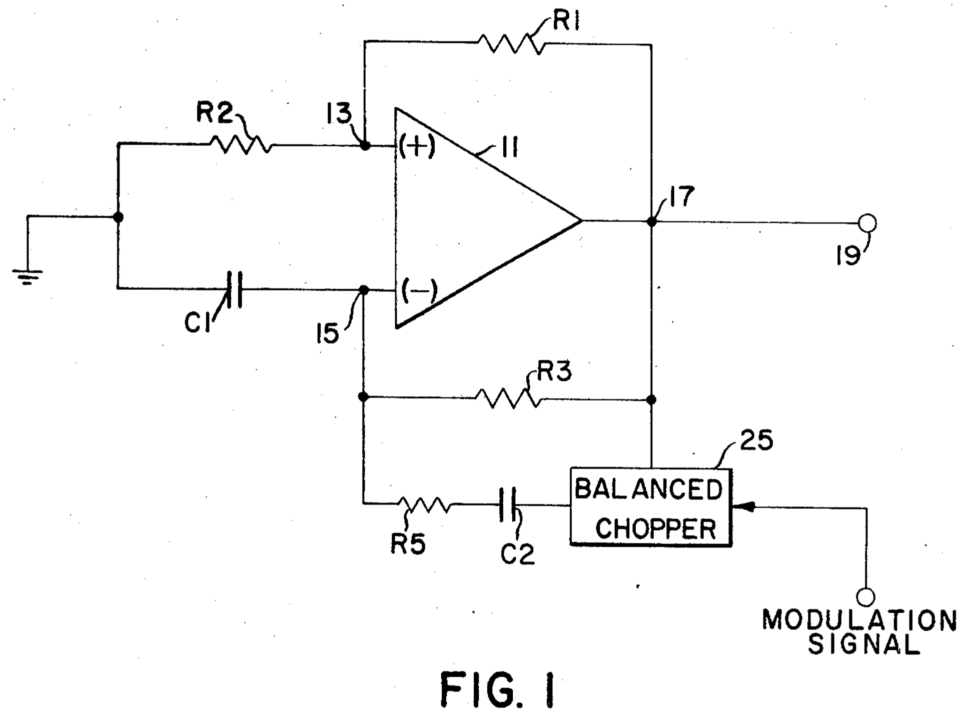
FIG. 1 is a block diagram of a voltage controllable oscillator constructed in accordance with the present invention.

Referring now to the drawing, there is indicated at 11 a conventional high gain differential amplifier. Amplifier 11 has a positive or noninverting input terminal 13 and a negative or inverting input terminal 15 and suitable positive and negative supply voltages with respect to ground are supplied to the amplifier from appropriate sources (not shown). The amplifier operates in conventional manner to provide, at an output terminal 17, an output signal which is a highly amplified function of an input signal applied between the input terminals 13 and 15. Preferably, amplifier 11 is of an integrated circuit-type providing close input circuit tracking. In other words, there is a very small voltage offset between the nominal input voltages and this offset does not vary significantly as a function of temperature. As is described in greater detail hereinafter, the output signal from amplifier 11 constitutes the output signal of the oscillator apparatus as a whole and this output signal is applied to an oscillator output terminal 19 for use in other circuitry forming no part of the present invention. A preselected amount of positive feedback is applied from the output terminal 17 to the noninverting input terminal 13 by means of a voltage-dividing resistive network comprising a pair of resistors R1 and R2 connected between the output terminal 17 and local ground. In addition, a delayed negative feedback signal is applied from the output terminal 17 to the inverting input terminal 15 by means of a network which includes a feedback resistor R3 and a capacitor C1. Capacitor C1 is connected between the inverting input terminal 15 and local ground and thus the signal applied to terminal 15 is a delayed or integrated function of the amplifier output signal, the amount of the delay being a function of the value of capacitor C1, though not solely so as is explained in greater detail hereinafter.

The positive feedback provided by resistors R1 and R2 causes the amplifier 11 to operate in a manner analogous to a Schmitt trigger with respect to input signals applied to the inverting input terminal 15. In other words, the amplifier 11 tends to be in saturation, either positive or negative depending upon the input signal, and to switch abruptly from one state to the other, limited only by the inherent slew rate of the amplifier. Once the output signal from the amplifier goes to its positive saturation value, it will remain there until the voltage at the inverting input terminal 15 reaches a first predetermined threshold. This first threshold will be positive with respect to ground in the circuit illustrated. When the input signal reaches the first threshold, the amplifier will then abruptly switch to its negative saturation state and will remain in that state until the voltage at the inverting input terminal 15 falls to a second threshold. In the circuit illustrated, this second threshold will be at a negative voltage. As a result of the differential between the two thresholds, there is in effect a so-called hysteresis in the response of the amplifier 11 with respect to signals applied to the inverting input terminal 15. As contrasted with the usual Schmitt circuit, however, the differential input circuit arrangement of the amplifier 11 will cause the two thresholds to be relatively stable with respect to each other, even despite substantial temperature variations. This is particularly true when the amplifier 11 is of the preferred, integrated circuit-type.

Figure 2:
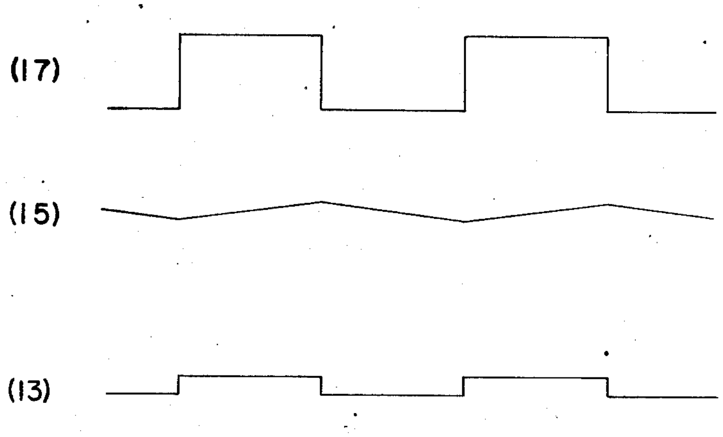
FIG. 2 represents various waveforms which occur in the apparatus of FIG. 1.

The effect of the delayed negative feedback signal applied at the input terminal 15, in combination with the positive feedback applied at input terminal 13, is to cause the amplifier 11 to oscillate at a frequency which is a function of the delay provided by capacitor C1. The mode of oscillation may be understood by reference to FIG. 2, where the waveforms occurring at the various amplifier terminals are represented on correspondingly designated lines. Assuming that the amplifier output signal is positive and that the voltage initially present at terminal 15 is below the positive threshold, the capacitor C1 charges through resistor R3. When, as a result of this charging, the voltage at terminal 15 reaches the positive threshold, the output signal from amplifier 11 switches abruptly to negative saturation and the capacitor C1 then discharges through resistor R3. When, as a result of this discharging, the voltage at terminal 15 reaches the negative threshold, the amplifier output signal again returns to positive saturation and the cycle begins anew. From the foregoing, it will be understood that the frequency of oscillation is, to a substantial extent, a function of the delay imparted to the negative feedback signal, i.e. a function of the time constant of capacitor C1 with resistor R3. The amplifier output signal is a square wave consistent with the switching character of its mode of operation, while the voltage at the input terminal 15 is substantially a triangular wave. As will be understood by those skilled in the art, the linearity of the ramps which form this triangular wave will depend upon the magnitude of the voltage separation or differential between the positive and negative switching thresholds in relation to the positive and negative saturation voltages. In order to provide highly linear operation, the resistors R1 and R2 are preferably selected to provide a separation or differential which is relatively small in relation to the separation between the saturation voltages.

The modulation signal which is to control the operating frequency of the oscillator is applied to a chopper 25. Chopper 25 is in turn synchronized or controlled by the output signal of the amplifier 11. Accordingly, the chopper provides an AC output signal which is synchronous with the amplifier output signal and which has an amplitude proportional to the amplitude of the applied modulation signal. The chopper output signal is in phase with the amplifier output signal when the modulation signal is positive and is out of phase with the amplifier output signal when the modulation signal is negative. Preferably, the chopper is of a balanced, solid-state construction providing a square wave output signal which is balanced with respect to ground, i.e. the AC signal from the chopper preferably does not have a DC component. The output signal from the chopper 25 is applied, through a blocking capacitor C2 and a buffer or mixing resistor R5, to the delay capacitor C1 and the inverting input terminal 15 of amplifier 11.

The effect of the AC signal applied to the capacitor C1 from the chopper 25 is to vary the effective delay in the negative feedback signal by varying the charging current applied to the capacitor C1. In other words, since the square wave AC signal provided by the chopper 25 is in synchronism with the amplifier output signal, the current flowing through resistor R5 will combine synchronously with that flowing through resistor R3 so as to affect the charging rate of the capacitor C1. Assuming that the modulation signal is positive with respect to ground so that the AC signal provided by chopper 25 is additive with the current provided to the capacitor through resistor R3, the effect of the added component is to shorten the delay, that is, the charging of the capacitor is hastened. Since each half cycle of oscillation requires that the potential on capacitor C1 change over a predetermined voltage differential, it can be seen that a change in the charging rate will affect the frequency of operation. In other words, if the rate of charging is increased on both half cycles, a higher frequency of oscillation will result and vice versa. Further, since the amplitude of the AC signal provided by the chopper 25 is proportional to the amplitude of the modulation signal, it can be seen that the operating frequency of the oscillator will vary as a function of this amplitude. Assuming that the differential between the switching thresholds is small in relation to the amplifier supply and saturation voltages as described earlier, it can also be seen that the variation in frequency with modulation signal voltage will be substantially linear.

As it is desired to maintain as great linearity as possible in the ramp voltages, it is preferred that only positive modulation signals be employed so that the AC signal provided by the chopper 25 is additive with the signal provided through resistor R3. However, negative modulation signals can be employed with only slightly less linear response if the component of the negative feedback signal coming from the chopper is maintained small in relation to that provided directly through resistor R3. In other words, the net current applied to the input terminal 15 and the capacitor C1 must be in phase with the amplifier output signal and preferably should be large enough to charge capacitor C1 substantially linearly in the range between the two switching thresholds.

One advantage to the use of the balanced chopper 25 as opposed to one of an unbalanced type is that the chopper output signal does not contain any substantial DC component. Thus, if the level of the modulation signal changes abruptly or includes relatively high frequency components, it is not necessary for the charge on the blocking capacitor C2 to follow these variations. With the balanced chopper illustrated, capacitor C2 functions mainly to block any residual DC levels at the input terminal 15 from the chopper.

In view of the foregoing, it may be seen that several objects of the present invention are achieved and other advantageous results have been attained.

As various changes could be made in the above construction without departing from the scope of the invention, it should be understood that all matter contained in the above description or shown in the accompanying drawings shall be interpreted as illustrative and not in a limiting sense.

I claim:

1. An oscillator for generating an output signal at a frequency which is controllable by means of a modulation signal applied to the oscillator, said oscillator comprising:
- a differential amplifier having an inverting input terminal, a noninverting input terminal, and an output terminal, said amplifier being operative to provide at said output terminal an output signal which is a highly amplified function of an input signal applied between said input terminals;
- a resistive network for applying a preselected amount of positive feedback from said output terminal to said noninverting input terminal; and
- variable delay means, including a capacitor, for applying to said inverting input terminal a negative feedback signal which is a delayed function of the amplifier output signal, the delay being a function of the value of said capacitor, thereby to cause said amplifier to oscillate at a frequency which is a function of the delay, said delay means including also modulating means for providing an AC signal which is synchronized with the amplifier output signal and which has an amplitude substantially proportional to the amplitude of said modulation signal, said AC signal being applied to said capacitor to vary the effective delay whereby the frequency of oscillation of said amplifier may be varied as a function of the amplitude of said modulation signal.

2. An oscillator as set forth in claim 1 wherein said amplifier is an integrated circuit differential amplifier providing close input circuit tracking.

3. An oscillator as set forth in claim 1 wherein said resistive network is a voltage divider connected between said output terminal and local ground for applying a predetermined proportion of said output signal to said noninverting input terminal.

4. An oscillator as set forth in claim 1 wherein said capacitor is connected between said inverting input terminal and local ground and wherein said delay means includes a resistance connected between said output terminal and said inverting input terminal.

5. An oscillator as set forth in claim 1 wherein modulating means comprises a signal chopper which operates on said modulation signal and is synchronized by the amplifier output signal.

6 An oscillator as set forth in claim 5 wherein said chopper is balanced and provides a square wave AC output signal having substantially no DC component.

7. An oscillator as set forth in claim 6 wherein said delay means includes a resistance connected between said output terminal and said capacitor for providing said delayed feedback signal and wherein the chopper output signal is applied to said capacitor through a second resistance for varying the effective delay as a function of the amplitude of said modulation signal.

8. An oscillator as set forth in claim 7 including a blocking capacitor in series with said second resistance.

9. An oscillator for generating an output signal at a frequency which is controllable by means of a modulation signal applied to the oscillator, said oscillator comprising:

a differential amplifier having an inverting input terminal, a noninverting input terminal, and an output terminal, said amplifier being operative to provide at said output terminal an output signal which is a highly amplified function of an input signal applied between said input terminals;

a resistive voltage divider for applying a preselected amount of positive feedback from said output terminal to said noninverting input terminal;

signal delay means, including a capacitor connected to said inverting input terminal and a resistance connected between said output terminal and said inverting input terminal, for applying to said inverting input terminal a negative feedback signal which is a delayed function of the amplifier output signal thereby to cause said amplifier to oscillate at a frequency which is a function of the delay;

a chopper which operates on said modulation signal and which is synchronized by the amplifier output signal thereby to generate an AC signal having an amplitude which is substantially proportional to the amplitude of said modulation signal; and means for applying said AC signal to said capacitor to vary the effective delay as a function of the amplitude of said modulation signal, whereby the frequency of oscillation of said amplifier may be varied under the control of said modulation signal.

10. An oscillator for generating an output signal at a frequency which is controllable by means of a modulation signal applied to the oscillator, said oscillator comprising:

a differential amplifier having an inverting input terminal, a noninverting input terminal, and an output terminal, said amplifier being operative to provide at said output terminal an output signal which is a highly amplified function of an input signal applied between said input terminals;

a resistive voltage divider for applying a preselected amount of positive feedback from said output terminal to said noninverting input terminal;

a capacitor connected between said inverting input terminal and local ground;

a first resistance connected between said output terminal and said inverting input terminal thereby to generate at said inverting input terminal a signal which is a delayed function of the amplifier output signal thereby to cause said amplifier to oscillate at a frequency which is a function of the delay;

a balanced chopper which operates on said modulation signal and which is synchronized by the amplifier output signal thereby to generate a square wave signal having a peak to peak AC amplitude which is substantially proportional varied the amplitude of said modulation signal and having substantially no DC component; and a second resistance for applying said square-wave signal to said capacitor to vary the effective delay as a function of the amplitude of said modulation signal, whereby the frequency of oscillation of said amplifier may be varied under the control of said modulation signal.

PO-1050
(5/69)

UNITED STATES PATENT OFFICE
CERTIFICATE OF CORRECTION

Patent No. 3,579,150 Dated May 18, 1971

Inventor(s) Rosario S. Badessa

It is certified that error appears in the above-identified patent and that said Letters Patent are hereby corrected as shown below:

In Claim 10, column 6, line 23, change "varied" to --to--.

Signed and sealed this 7th day of September 1971.

(SEAL)
Attest:

EDWARD M.FLETCHER,JR.
Attesting Officer

ROBERT GOTTSCHALK
Acting Commissioner of Patents